May 11, 1965 W. V. HARRISON 3,183,375
PULSE GENERATOR UTILIZING TUNNEL DIODE
Filed July 31, 1961

INVENTOR
Wesley V. Harrison

BY *John G. Graham*
ATTORNEY

United States Patent Office 3,183,375
Patented May 11, 1965

3,183,375

PULSE GENERATOR UTILIZING TUNNEL DIODE

Wesley V. Harrison, Houston, Tex., assignor to Texas Instruments Incorporated, Dallas, Tex., a corporation of Delaware Filed July 31, 1961, Ser. No. 127,915
4 Claims. (Cl. 307—106)

This invention relates to apparatus for generating electrical pulses of very narrow pulse width and at a high repetition rate.

A pulse generator capable of providing pulses of a width of about one nanosecond or less and a repetition rate of around 100 megacycles or more has not heretofore been available. The advent of the tunnel diode has provided a circuit device having a switching time on the order of less than one nanosecond, and it is presently proposed to make advantageous use of the extremely rapid switching time of a tunnel diode to provide a pulse generator having correspondingly fast characteristics.

It is the principal object of this invention to provide apparatus for generating an electrical pulse train having a high repetition rate and very short pulse duration, the pulse repetition rate being variable without altering the pulse width. Another object is to provide a pulse generator having very high performance characteristics and utilizing a minimum of components and circuitry.

In accordance with this invention, a tunnel diode is connected in series with a resistor to provide a bistable device. The bistable device is driven by a source of periodic pulses having an amplitude adequate to switch the tunnel diode into its high voltage state. The voltage waveform appearing across the tunnel diode is differentiated to provide an output pulse train having a repetition rate determined by the frequency of the source and having a pulse width determined by the switching time of the tunnel diode and the time constant of the differentiating circuit.

The novel features believed characteristic of this invention are set forth in the appended claims. The invention itself, however, along with further objects and advantages thereof, will best be understood by reference to the following description of a particular embodiment, when read in conjunction with the accompanying drawing, in which:

Figure 1:
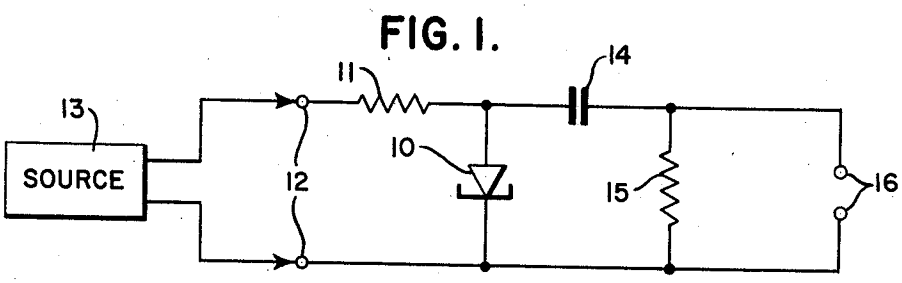
FIGURE 1 is a schematic diagram of a pulse generator circuit incorporating the principal features of this invention.

With reference to FIGURE 1, the pulse generator of this invention is seen embodied in a circuit including a tunnel diode 10 connected in series with a resistor 11 and across a pair of input terminals 12. A drive source 13 is connected across the input terminals 12 and may comprise a source of sinusoidal, square wave or pulse signals, preferably periodic, having an amplitude determined by the characteristics of the tunnel diode 10 and the value of the resistor 11, as will appear hereinafter. A differentiating circuit, including a capacitor 14 and a resistor 15 connected in series, is connected across the tunnel diode 10. Since it is necessary that the pulse generator have an output pulse width on the order of one nanosecond or less, the time constant of the differentiating circuit will have to be of the same order of magnitude. Thus, the value of the capacitor 14 will be in the order of magnitude of 10 picofarads, while the resistor 15 cannot be of a magnitude much greater than about 100 ohms. The output of the pulse generator circuit appears across the resistor 15 at a pair of output terminals 16, which may be applied to a suitable amplifier to raise the output level to any appropriate magnitude.

Figure 2:
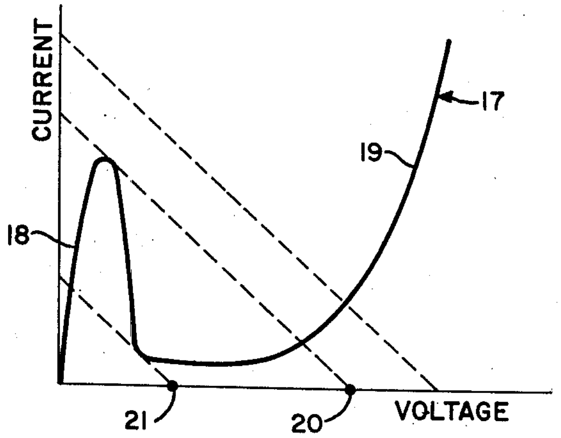
FIGURE 2 is a graphic representation of the current versus voltage characteristics of a tunnel diode utilized in the circuit of FIGURE 1.

The characteristics of the tunnel diode 10 in series with the resistor 11 may be be understood by reference to FIGURE 2, wherein the current-voltage curve of the circuit is represented by a line 17. The tunnel diode characteristic is seen to include a pair of positive resistance regions 18 and 19 separated by a region of negative resistance. A plurality of load lines are seen superimposed on the tunnel diode characteristic. These diagonal load lines have a slope determined by the value of the resistor 11 and have a point of intersection with the horizontal axis which is determined by the instantaneous voltage appearing across the input terminals 12. It is seen that the current through the tunnel diode will be high and the voltage across the tunnel diode will be relatively low until the voltage across the terminals 12 reaches a level 20, whereupon the operating point of the bistable device including the tunnel diode 10 and the resistor 11 is switched extremely rapidly from the positive resistance portion 18 to the portion 19 of the curve. It is this transition from the low voltage to the high voltage states of the tunnel diode circuit that is utilized as the leading edge of the very sharp output pulses of the pulse generator. The tunnel diode will remain at the high voltage state and the voltage across the tunnel diode will remain fairly constant even though the voltage appearing at the terminals 12 increases far above the level 20. As the voltage at the input decreases below the level 20, the tunnel diode will remain in the high-voltage, low-current state until a point 21 is reached, whereupon the operating point of the circuit will switch back to the region 18 of the curve 17.

Figure 3:
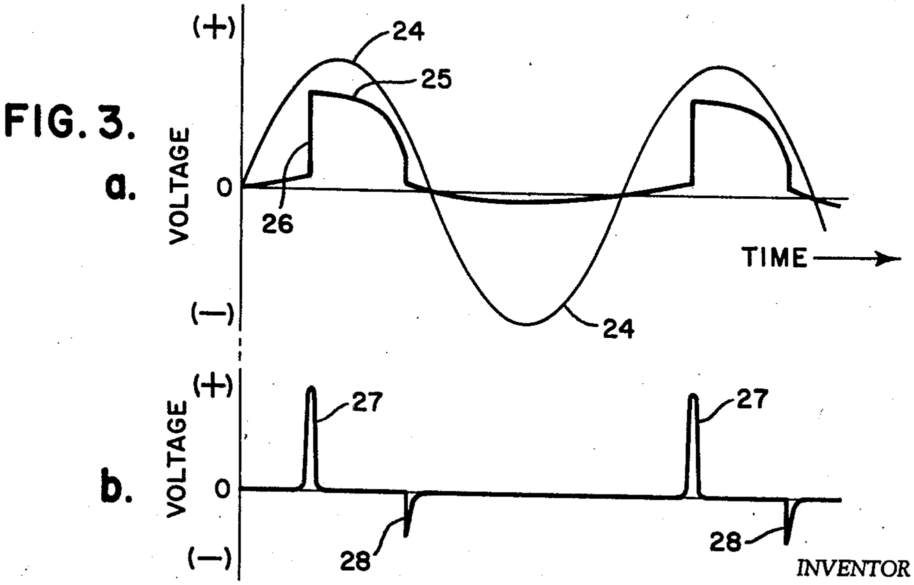
FIGURES 3*a* and 3*b* are graphic representations of voltage waveforms appearing at various points in the circuit of FIGURE 1.

If the source 13 provides a sinusoidal output, such as a waveform 24 as seen in FIGURE 3*a*, and the peak value of this waveform exceeds the level 20 in FIGURE 2, then the voltage appearing across the tunnel diode 10 will have a waveform 25. The pulses of the waveform 25 will have steep leading edges 26 occurring each time the tunnel diode switches from the low-voltage to the high-voltage state. The waveform 25 may be differentiated to provide a series of positive pulses 27 as seen in FIGURE 3*b* which appear at the output terminals 16. A negative excursion 28 occurs after each positive spike 27 at the time when the tunnel diode switches from the high-voltage to the low-voltage state, but these negative excursions may be clipped by a subsequent amplifier, leaving only the narrow high amplitude pulses 27.

It is seen that a pulse generator is provided which is capable of producing output pulses at a very high repetition rate as determined by the frequency of the source 13. The pulse width of each pulse will be substantially constant and will be determined by the switching time of the tunnel diode 10 and the time constant of the RC differentiating circuit.

While this invention has been described with reference to a particular embodiment, the description is not intended to be construed in a limiting sense. It is, of course, understood that various modifications may be made by persons skilled in the art, and so it is contemplated that the appended claims will cover any such modifications that fall within the true scope of this invention.

What is claimed is:

1. A pulse generator comprising a tunnel diode and a resistor connected in series across an alternating voltage source, said voltage source having a peak value greater than the level necessary to exceed the peak current of said tunnel diode, a differentiating circuit including a resistor and a capacitor connected across said tunnel diode, said differentiating circuit having a time constant much less than the period of said alternating voltage and of the same order of magnitude as the switching time of said tunnel diode, and utilization means connected across said resistor.

2. A pulse generator comprising a tunnel diode and a resistor connected in a closed series circuit with a source of periodic electrical pulses, said pulses having a peak magnitude exceeding the level necessary to switch said tunnel diode to its high-voltage state, differentiating means connected across said tunnel diode and having a time constant of the same order of magnitude as the switching time of said tunnel diode, and utilization means connected to the output of said differentiating means.

3. A pulse generator comprising a bistable circuit having an input and an output and composed of a tunnel diode and impedance means connected serially, a source of periodic electrical pulses having a magnitude adequate to drive said bistable circuit from one stable state to the other stable state, said source being connected to said input of said bistable circuit, and a differentiating circuit having an input and an output, said input of said differentiating circuit being connected to said output of said bistable circuit, said differentiating circuit having a time constant of the same order of magnitude as the transition time of said bistable circuit when switching from one stable state to the other stable state.

4. A pulse generator comprising a voltage-responsive circuit having an input and an output, said voltage-responsive circuit being adapted to switch from a first condition to a second condition when the voltage at said input exceeds a predetermined level, said voltage-responsive circuit being composed of a tunnel diode connected in series with a resistor, a source of periodic electrical pulses having a peak magnitude exceeding said predetermined level, said source being connected to said input of said voltage-responsive circuit, and a differentiating circuit having an input and an output and exhibiting a time constant much less than the period of said electrical pulses, said input of said differentiating circuit being connected to said output of said voltage-responsive circuit.

References Cited by the Examiner

UNITED STATES PATENTS

| | | | |
|---|---|---|---|
| 2,986,724 | 5/61 | Jaeger | 307—88.5 |
| 3,017,613 | 1/62 | Miller | 307—88.5 |
| 3,056,048 | 9/62 | McGrogan | 307—88.5 |
| 3,103,597 | 9/63 | Novick et al. | 307—88.5 |

FOREIGN PATENTS

| | | |
|---|---|---|
| 514,778 | 4/53 | Belgium. |
| 1,249,045 | 11/60 | France. |

OTHER REFERENCES

"I.B.M.–53," Technical Disclosure Bulletin, vol. 2, No. 5, February 1960, pages 53 and 54.

"I.B.M.–138," Technical Disclosure Bulletin, vol. 3, No. 10, March 1961, page 138.

G.E. Tunnel Diode Manual, copyright date: Mar. 20, 1961, pages 48 and 49.

Junction Transistor Electronics, Richard B. Hurley, John Wiley & Sons, Inc., New York, copyright 1958, page 410.

LLOYD McCOLLUM, *Primary Examiner.*

MILTON O. HIRSHFIELD, *Examiner.*